(12) United States Patent
Keller (10) Patent No.: US 8,097,911 B2
(45) Date of Patent: Jan. 17, 2012

(54) ETCH STOP STRUCTURES FOR FLOATING GATE DEVICES

(75) Inventor: Dave Keller, Boise, ID (US)

(73) Assignee: Intel Corporation, Santa Clara, CA (US)

(*) Notice: Subject to any disclaimer, the term of this patent is extended or adjusted under 35 U.S.C. 154(b) by 398 days.

(21) Appl. No.: 12/347,805

(22) Filed: Dec. 31, 2008

(65) Prior Publication Data

US 2010/0163959 A1    Jul. 1, 2010

(51) Int. Cl.
*H01L 29/788* (2006.01)
(52) U.S. Cl. .............. 257/316; 257/321; 257/E29.129
(58) Field of Classification Search .............. 257/315, 257/316, 321, E29.129, E29.3
See application file for complete search history.

(56) References Cited

U.S. PATENT DOCUMENTS

| | | | |
|---|---|---|---|
| 5,111,270 A * | 5/1992 | Tzeng | 365/185.29 |
| 6,261,905 B1 * | 7/2001 | Chen et al. | 438/264 |
| 6,265,292 B1 | 7/2001 | Wada | |
| 6,284,596 B1 * | 9/2001 | Sung et al. | 438/257 |
| 6,518,618 B1 | 2/2003 | Wada | |
| 6,943,071 B2 | 9/2005 | Wada | |
| 6,972,230 B1 * | 12/2005 | Pan et al. | 438/257 |
| 7,157,762 B2 * | 1/2007 | Lee | 257/296 |
| 7,183,162 B1 | 2/2007 | Soss | |
| 7,187,591 B2 | 3/2007 | Fastow et al. | |
| 7,589,374 B2 * | 9/2009 | Song et al. | 257/315 |
| 7,615,436 B2 * | 11/2009 | Kouznetsov et al. | 438/201 |
| 7,679,128 B2 * | 3/2010 | Matsuzaki | 257/316 |
| 7,709,308 B2 * | 5/2010 | Oh et al. | 438/164 |
| 2004/0175886 A1 * | 9/2004 | Slotboom et al. | 438/257 |
| 2005/0258471 A1 * | 11/2005 | Lee | 257/315 |
| 2008/0237680 A1 | 10/2008 | Pangal | |

OTHER PUBLICATIONS

Krishnamohan, Tejas, et al., "Non-Volatile Memory Cell with Multi-layer Blocking Dielectric", U.S. Appl. No. 11/771,482, filed: Jun. 29, 2007.
Min, Kyu S., "Self-Aligned Charge-Trapping Layers for Non-Volatile Data Storage, Processes of Forming Same, and Deivices Containing Same", U.S. Appl. No. 11/693,925, filed Mar. 30, 2007.
Min, Kyu S., "High-K Trilayer Dielectrice Device and Methods", U.S. Appl. No. 11/694,059, filed Mar. 30, 2007.
Krishnamohan, Tejas, et al., "Floating Gate Structures", U.S. Appl. No. 12/165,272, filed Jun. 30, 2008.

* cited by examiner

*Primary Examiner* — Evan Pert
(74) *Attorney, Agent, or Firm* — Cool Patent, P.C.; Joseph P. Curtin (57) ABSTRACT

Etch stop structures for floating gate devices are generally described. In one example, a floating gate device includes a semiconductor substrate having a surface on which one or more floating gate devices are formed, a tunnel dielectric coupled with the surface of the semiconductor substrate, a floating gate structure coupled with the tunnel dielectric, the floating gate structure having a first surface, a second surface, and a third surface, wherein the third surface is substantially parallel with the surface of the semiconductor substrate and wherein the first surface is substantially parallel with the second surface and substantially perpendicular with the third surface, an etch stop film coupled with the third surface of the floating gate structure, and an inter-gate dielectric coupled with the first surface and the second surface of the floating gate structure wherein the inter-gate dielectric comprises a material that is less resistant to an etchant that removes material of a control gate structure than the etch stop film.

12 Claims, 6 Drawing Sheets

ETCH STOP STRUCTURES FOR FLOATING GATE DEVICES

TECHNICAL FIELD

Embodiments described herein are generally directed to the field of semiconductor device fabrication and, more particularly, to etch-stop structures for floating-gate devices.

BACKGROUND

Generally, semiconductor devices, such as, memory may comprise a floating-gate device. Floating-gate devices may comprise a floating gate or charge-trap node to store charge. Poor etch selectivity between an etchant and an inter-gate dielectric formed on the floating gate may result in poor etch profiles, microloading effects, and/or poor etch uniformity across multiple structures.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of etch-stop structures for floating-gate devices are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
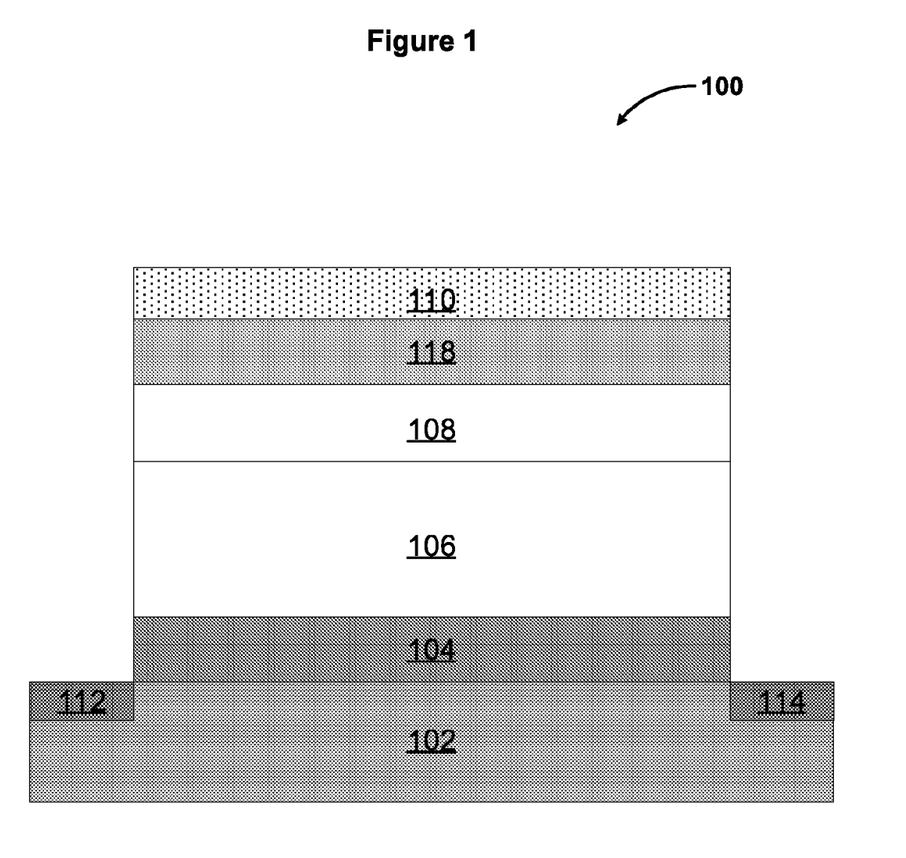
FIG. 1 is an elevation cross-section schematic of a floating gate device comprising an etch stop film, according to but one embodiment.

FIG. 1 is an elevation cross-section schematic of a floating-gate device comprising an etch-stop film, according to but one embodiment. In an embodiment, a floating-gate device 100 includes a semiconductor substrate 102, tunnel dielectric 104, floating-gate structure 106, etch-stop film 108, inter-gate dielectric 118, control gate structure 110, source 112, and drain 114, coupled as shown. FIG. 1 may represent a cross-section along a wordline of a floating-gate device.

Floating-gate (FG) technology may use a "floating" gate 106 to store charge. A floating gate 106 may be "floating" in the sense that a surface of the floating gate 106 is insulated by a tunnel dielectric 104 and another surface of the floating gate 106 is insulated by an inter-gate dielectric (IGD) 118, which may be referred to as inter-poly dielectric (IPD) or "blocking" dielectric in other embodiments. In an embodiment, etch-stop film 108 functions as an IGD or blocking dielectric for floating-gate device 100.

Semiconductor substrate 102 may comprise a surface on which one or more floating-gate devices 100 are formed. Semiconductor substrate 102 may comprise silicon (Si) or any other suitable semiconductor material. Source 112 and drain 114 regions may comprise doped semiconductor substrate such as, for example, doped Si. Source 112 and drain 114 regions may comprise n-type or p-type dopants in various embodiments. Subject matter is not limited in this regard and semiconductor substrate 102, source 112, and drain 114 may comprise other materials and/or dopants in other embodiments.

Floating-gate device 100 may include a tunnel dielectric 104 coupled with the surface of the semiconductor substrate 102. In an embodiment, tunnel dielectric 104 comprises an oxide material. For example, a tunnel dielectric 104 comprising $SiO_2$ may be coupled to a semiconductor substrate 102 comprising Si and may include multiple layers and/or materials. In another embodiment, tunnel dielectric 104 comprises any form of dielectric that provides tunneling behavior of electrons or holes consistent with a floating-gate device 100. Tunnel dielectric 104 may comprise a thickness of about 3 nm to about 10 nm effective oxide thickness (EOT) in one embodiment.

In an embodiment, floating-gate device 100 includes a floating-gate structure 106 coupled with the tunnel dielectric 104. Floating-gate structure 106 may store charge in a floating-gate device 100. In an embodiment, floating-gate structure 106 comprises one or more layers and comprises one or more materials and may have a thickness less than about 30 nm. Layers within floating-gate structure 106 may be selected to have desired attributes such as, for example, carrier relaxation time, electronic work function, thermal stability, or doping concentration, or combinations thereof, to produce desired program, erase, retention, and/or reliability properties of floating-gate device 100.

In an embodiment, floating-gate structure 106 comprises polysilicon, metal, metal nitride, metal silicide, metal silicon nitride, metal carbide, metal carbon nitride, or a conductive metal oxide, or combinations thereof. Polysilicon may comprise n-type or p-type doped polysilicon. In an embodiment, a metal comprises, for example, tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof. The metal nitride may comprise, for example, titanium nitride (TiN), tungsten nitride (WN), or tantalum nitride (TaN), or combinations thereof. The metal silicide may comprise, for example, titanium silicide (TiSi), tungsten silicide (WSi), tantalum silicide (TaSi), cobalt silicide (CoSi), platinum silicide (PtSi), nickel silicide (NiSi), or combinations thereof. The metal silicon nitride may comprise, for example, titanium silicon nitride (TiSiN), or tantalum silicon nitride (TaSiN), or combinations thereof. The metal carbide may comprise, for example, titanium carbide (TiC), zirconium carbide (ZrC), tantalum carbide (TaC), hafnium carbide (HfC), or aluminum carbide (AlC), or combinations thereof. The metal carbon nitride may comprise, for example, tantalum carbon nitride (TaCN), titanium carbon nitride (TiCN), or combinations thereof. A conductive metal oxide may comprise, for example, ruthenium oxide ($RuO_2$). Other material combinations are possible within the scope of the subject matter described herein.

Floating-gate device 100 may comprise an etch-stop film 108. Etch-stop film 108 may be coupled with the floating-gate structure 106. In an embodiment, etch-stop film 108 comprises aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), silicon oxide ($SiO_2$), silicon oxynitride ($SiO_xN_y$), silicon nitride ($Si_xN_y$), or combinations thereof. The variables x, y, and z may represent suitable quantities of the respective elements. Subject matter is not limited in this regard and etch-stop film 108 may include other materials in other embodiments.

Figure 4:
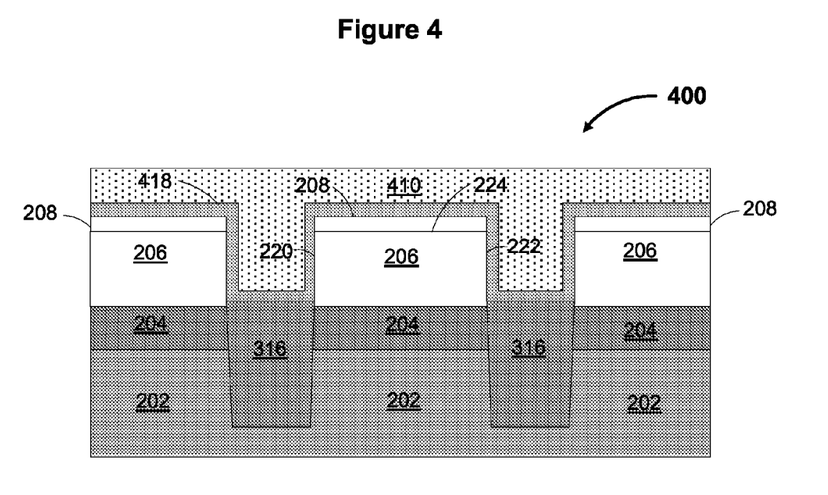
FIG. 4 is another elevation cross-section schematic of a floating gate device in fabrication, according to but one embodiment.

Etch-stop film 108 may provide an etch barrier to the floating-gate structure 106 during a process operation wherein etchant removes a control gate material 410 described further with respect to FIG. 4. In an embodiment, etch-stop film 108 comprises a thickness that is less than about 30 nm. Etch-stop film 108 may be selected to provide desired attributes such as, for example, trap depth, trap density, electron or hole barrier heights, or dielectric constant, or combinations thereof, in a floating-gate device 100. In another embodiment, etch-stop film 108 serves as a blocking dielectric between the floating-gate structure 106 and a control gate structure 110 coupled with the etch-stop film 108.

In an embodiment, an inter-gate dielectric film 118 may be coupled with the etch-stop film 108. Inter-gate dielectric 118 may comprise a material that is less resistant to an etchant that removes material of control gate structure 110 than the etch-stop film 108. In an embodiment, inter-gate dielectric 118 includes silicon oxide ($SiO_2$), silicon nitride (SiN), alternating films of silicon oxide and silicon nitride (ONO), or NONON, or combinations thereof. Inter-gate dielectric 118 may be selected to provide desired attributes such as, for example, trap depth, trap density, electron or hole barrier heights, or dielectric constant, or combinations thereof, in a floating-gate device 100. Combinations of materials and thicknesses for inter-gate dielectric 118 and etch-stop film 108 may be selected to provide desired characteristics as described above.

Floating-gate device 100 may further include a control gate structure 110. In an embodiment, control gate structure 110 is coupled with the inter-gate dielectric 118. Control gate structure 110 may be coupled with the inter-gate dielectric 118 in a region within or underlying the wordline in which an etchant does not remove material of the control gate structure as described with respect to FIGS. 4-5. Control gate structure 110 may comprise polysilicon, metal, metal nitride, metal silicide, metal silicon nitride, metal carbide, metal carbon nitride, or a conductive metal oxide, or combinations thereof. In an embodiment, control gate structure 110 includes example materials described herein for floating-gate structure 106. Control gate structure 110 may comprise higher work function metals. In an embodiment, a voltage may be applied to the control gate structure 110 to modify a charge stored on the floating-gate structure 106. Control gate structure 110 may have a lower bandgap than the etch-stop film 108 or the inter-gate dielectric 118.

Floating-gate device 100 may be part of a NAND flash memory array in an embodiment. Claimed subject matter is not limited in this regard and may include other forms of memory or electronic device that incorporates a floating-gate device 100.

Figure 2:
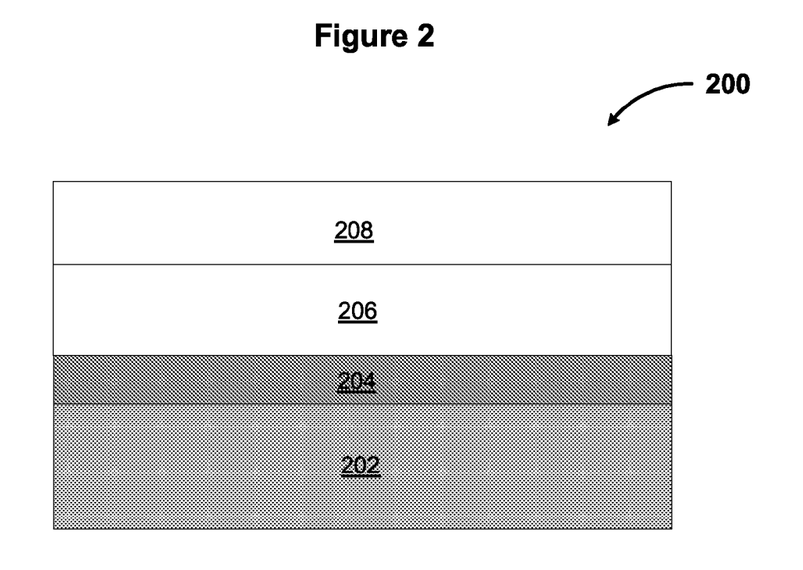
FIG. 2 is an elevation cross-section schematic of a floating gate device in fabrication, according to but one embodiment.

FIG. 2 is an elevation cross-section schematic of a floating-gate device in fabrication, according to but one embodiment. In an embodiment, floating-gate device 200 includes a semiconductor substrate 202, tunnel dielectric 204, floating-gate structure 206, and etch-stop film 208, coupled as shown. FIG. 2 may depict a floating-gate device 200 in fabrication prior to formation of isolation dielectric structures 316, such as shallow trench isolation (STI).

In an embodiment, tunnel dielectric 204 is deposited on semiconductor substrate 202, floating-gate material 206 is deposited on the tunnel dielectric 204, and an etch-stop film is deposited on floating-gate material 206. Deposition as described herein may include any suitable deposition method including oxide growth, chemical vapor deposition (CVD), physical vapor deposition (PVD), or atomic layer deposition (ALD) techniques, or combinations thereof, and claimed subject matter is not limited in this regard.

Figure 3:
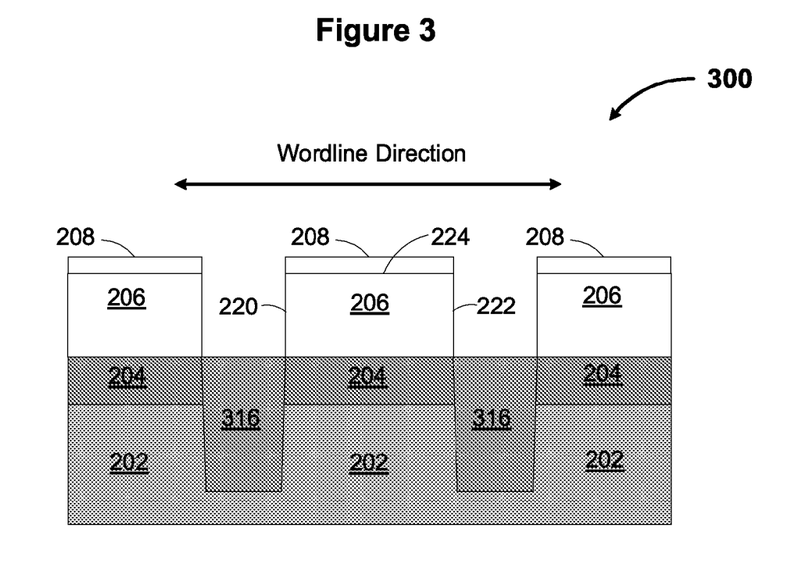
FIG. 3 is another elevation cross-section schematic of a floating gate device in fabrication, according to but one embodiment.

FIG. 3 is another elevation cross-section schematic of a floating-gate device in fabrication, according to but one embodiment. In an embodiment, floating-gate device 300 includes semiconductor substrate 202, one or more tunnel dielectrics 204, one or more floating-gate structures 206, one or more etch-stop films 208, and one or more isolation dielectric structures 316, coupled as shown. FIG. 3 may depict a floating-gate device 300 in fabrication after formation of one or more isolation dielectric structures 316. The arrows may indicate a wordline direction.

Floating-gate device 300 may comprise a variety of materials including those described with respect to FIG. 1. In but one example embodiment, floating-gate device 300 includes a semiconductor substrate 202 comprising silicon (Si), a tunnel dielectric 204 comprising silicon oxide ($SiO_2$), a floating-gate structure 206 comprising polysilicon, and an etch-stop film 208 comprising $Al_2O_3$. Claimed subject matter is not limited in this regard and may include other materials in other embodiments.

Floating-gate device 300 may be formed by patterning isolation regions into floating-gate device 200 and depositing an isolation dielectric 316 material into the patterned isolation region. Patterning may be accomplished by any suitable method including lithography and/or etch processes to selectively remove material 208, 206, 204, 202 and form one or more trenches for isolation dielectric 316. Other semiconductor fabrication processes may be used. In an embodiment, polishing such as chemical mechanical polishing (CMP) is used to polish deposited isolation dielectric 316 and an etch process is used to further recess the deposited isolation dielectric 316. Subject matter is not limited in this regard and other processes may be used to form one or more isolation dielectric 316 structures.

Floating-gate structures 206 may have a first surface 220, a second surface 222, and a third surface 224. In an embodiment, the third surface 224 is substantially parallel with the surface of the semiconductor substrate 202 upon which the one or more floating-gate structures 206 are formed. In another embodiment, first surface 220 is substantially parallel with the second surface 222. In yet another embodiment, the first surface 220 is substantially perpendicular with the third surface 224. Substantially perpendicular and substantially parallel may be broadly construed. For example, an etch profile of floating-gate structure 206 may result in more rounded characteristics, or more sloped sidewalls 220, 222 than depicted. In an embodiment, substantially parallel includes surfaces that are within about 40 degrees of one another. In an embodiment, the third surface 224 is coupled with an etch-stop film 208.

FIG. 4 is another elevation cross-section schematic of a floating-gate device in fabrication, according to but one embodiment. In an embodiment, floating-gate device 400 includes semiconductor substrate 202, one or more tunnel dielectrics 204, one or more floating-gate structures 206, one or more etch-stop films 208, one or more isolation dielectric structures 316, inter-gate dielectric 418, and control gate material 410, coupled as shown. FIG. 4 may depict a floating-gate device 400 in fabrication after deposition of inter-gate dielectric 418 and control gate material 410. Deposition as described herein may include any suitable deposition method including oxide growth, chemical vapor deposition (CVD), physical vapor deposition (PVD), or atomic layer deposition (ALD) techniques, or combinations thereof, and claimed subject matter is not limited in this regard.

In an embodiment, an inter-gate dielectric 418 is deposited to the first surface 220 and the second surface 222 of the floating-gate structure 206 and to the etch-stop film 208. Inter-gate dielectric 418 may comprise a material that is less resistant to an etchant that removes material of control gate structure 410 than the etch-stop film 208. In an embodiment, inter-gate dielectric 418 includes silicon oxide ($SiO_2$), silicon nitride (SiN), alternating films of silicon oxide and silicon nitride (ONO), or NONON, or combinations thereof. In an embodiment, inter-gate dielectric 418 is conformally grown or deposited to the exposed surfaces of a floating-gate device 300 according to FIG. 3.

A control gate material 410 may be deposited to the inter-gate dielectric 418. Control gate material 410 may comprise material that is intended to be partially or substantially removed in a subsequent operation from a region or area between wordlines of a memory device. In an embodiment, control gate material 410 includes polysilicon, metal, metal nitride, metal silicide, metal silicon nitride, metal carbide, metal carbon nitride, or a conductive metal oxide, or combinations thereof. Control gate material 410 may include materials described with respect to floating-gate structure 206.

Figure 5:
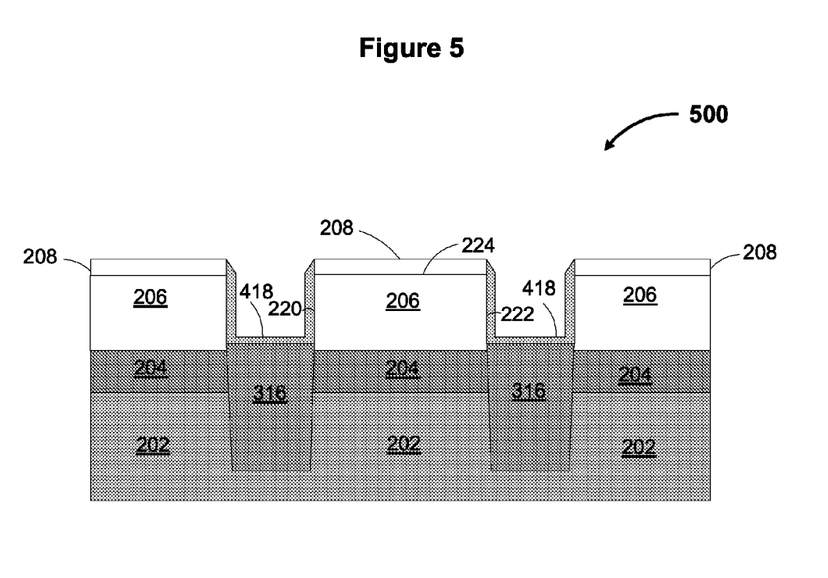
FIG. 5 is another elevation cross-section schematic of a floating gate device in fabrication, according to but one embodiment.

FIG. 5 is another elevation cross-section schematic of a floating-gate device in fabrication, according to but one embodiment. In an embodiment, floating-gate device 500 includes semiconductor substrate 202, one or more tunnel dielectrics 204, one or more floating-gate structures 206, one or more etch-stop films 208, one or more isolation dielectric structures 316, and inter-gate dielectric 418 coupled as shown. FIG. 5 may depict a floating-gate device 500 in fabrication after control gate material 410 has been substantially removed. In an embodiment, FIG. 5 represents a cross-section in an area between wordlines, the cross-section being in the direction of the wordlines. In an embodiment, control gate material 410 is removed in a region between wordlines and is not removed in a region within or underlying the wordlines.

Control gate material 410 may be substantially removed by etching. In an embodiment, the etch stop film 208 prevents removal of the floating-gate structure 206 during etching of the control gate material 410. In another embodiment, the etch-stop film 208 is more resistant to etching than the inter-gate dielectric 418 when substantially removing the control gate material 410 by an etchant. An etchant for removing the control gate material 410 may include, for example, etch chemistries comprising mixtures of oxygen ($O_2$) with hydrogen bromide (HBr), tetrafluoromethane ($CF_4$), nitrogen trifluoride ($NF_3$), chlorine ($Cl_2$), or sulfur hexafluoride ($SF_6$), or combinations thereof, but claimed subject matter is not limited in this regard. In other embodiments, an etchant may include any etchant that more readily etches the inter-gate dielectric 418 than the etch-stop film 208. An etch-stop film 208 as described herein may increase a process window for etching control gate material 410, reduce microloading, facilitate removal of control gate material 410 for higher aspect ratio structures, increase vertical profile of the first 220 and second surfaces 222 of the floating-gate structure 206, increase etch uniformity, or combinations thereof.

In an embodiment, a floating-gate device 500 includes a semiconductor substrate 202 having a surface on which one or more floating-gate structures 206 are formed, a tunnel dielectric 204 coupled with the surface of the semiconductor substrate 202, and a floating-gate structure 206 coupled with the tunnel dielectric 204, the floating-gate structure 206 having a first surface 229, a second surface 222, and a third surface 224 wherein the third surface 224 is substantially parallel with the surface of the semiconductor substrate 202 and wherein the first surface 220 is substantially parallel with the second surface 222 and substantially perpendicular with the third surface 224. Floating-gate device 500 may further include an etch-stop film 208 coupled with the third surface 224 of the floating-gate structure 206, and an inter-gate dielectric 418 coupled with the first surface 220 and the second surface 222 of the floating-gate structure. The inter-gate dielectric 418 may comprise a material that is less resistant to an etchant that removes material of a control gate structure 410 than the etch-stop film 208.

Figure 6:
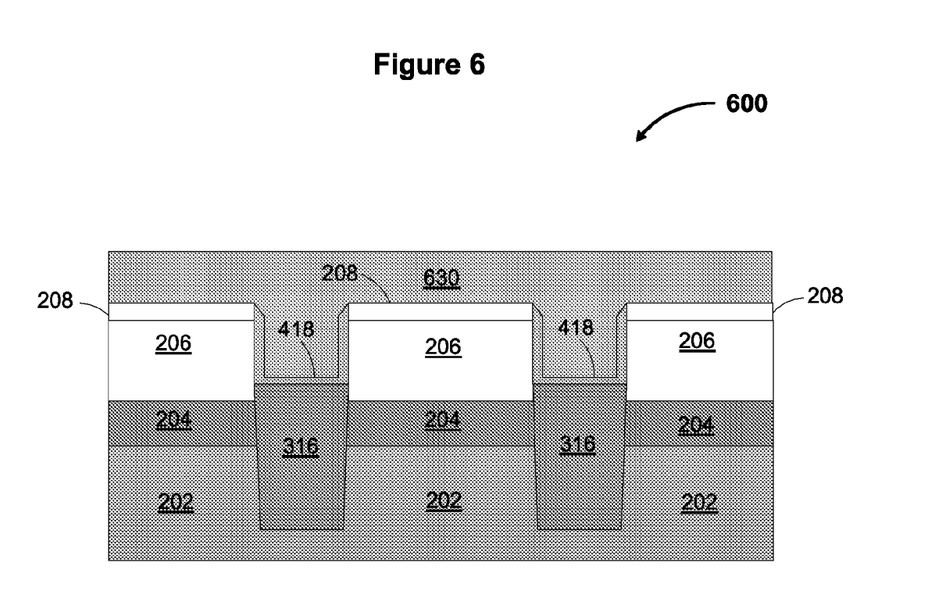
FIG. 6 is yet another elevation cross-section schematic of a floating gate device in fabrication, according to but one embodiment.

FIG. 6 is yet another elevation cross-section schematic of a floating-gate device in fabrication, according to but one embodiment. In an embodiment, floating-gate device 600 includes semiconductor substrate 202, one or more tunnel dielectrics 204, one or more floating-gate structures 206, one or more etch-stop films 208, one or more isolation dielectric structures 316, inter-gate dielectric 418, and dielectric material 630, coupled as shown. FIG. 6 may depict a floating-gate device 600 in fabrication after dielectric material 630 has been deposited. In an embodiment, FIG. 6 depicts a region between wordlines of a memory device.

Dielectric 630 may be deposited by any suitable deposition method including, for example, chemical vapor deposition (CVD), physical vapor deposition (PVD), and/or atomic layer deposition (ALD) techniques. In an embodiment, material 630 comprises an oxide such as silicon oxide ($SiO_2$). Other suitable materials may be used in other embodiments.

Figure 7:
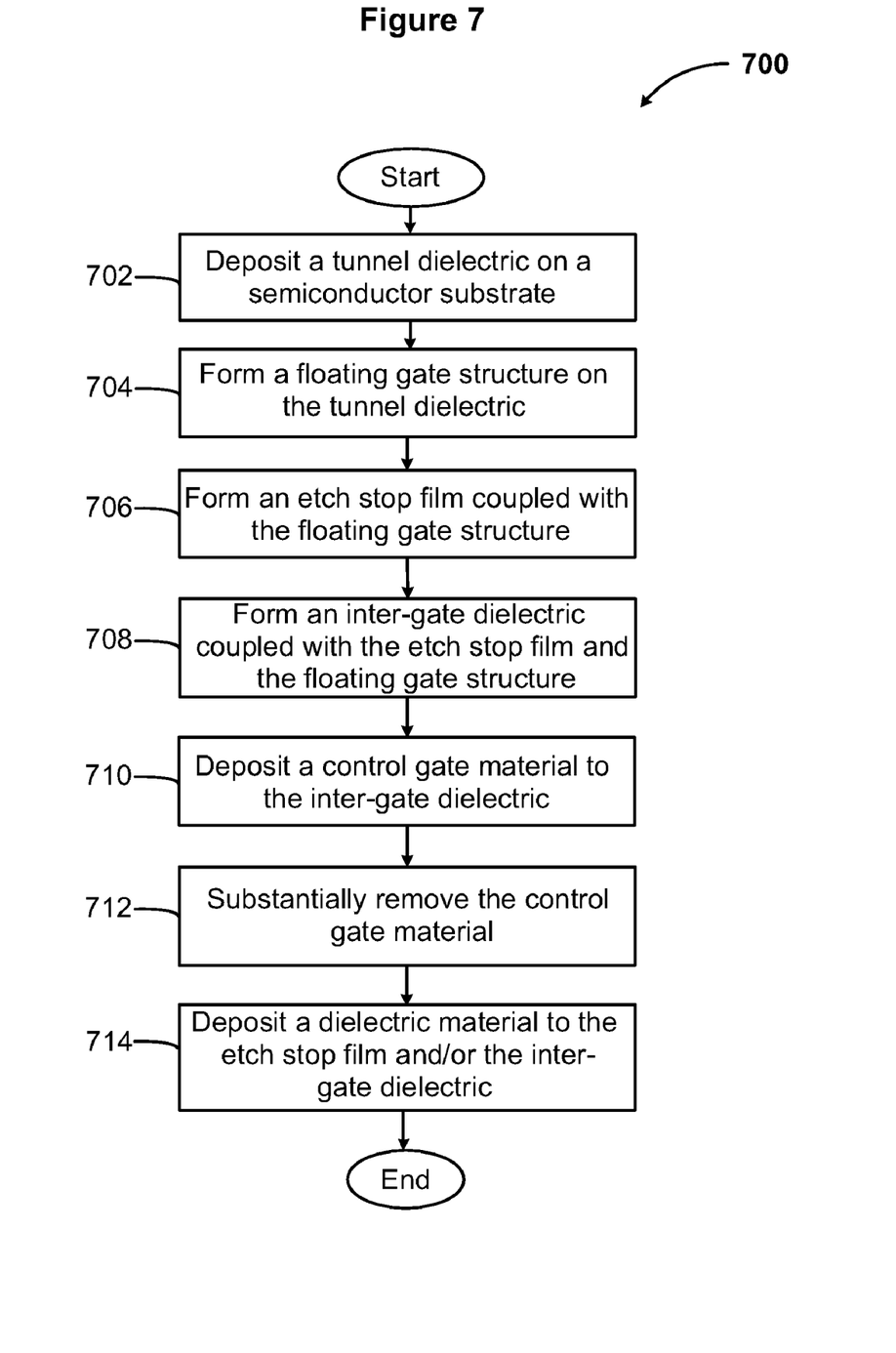
FIG. 7 is a flow diagram for a method to fabricate a floating gate device, according to but one embodiment.

FIG. 7 is a flow diagram for a method to fabricate a floating-gate device, according to but one embodiment. In an embodiment, method 700 includes depositing a tunnel dielectric on a semiconductor substrate at box 702, forming a floating-gate structure on the tunnel dielectric at box 704, forming an etch-stop film coupled with the floating-gate structure at box 706, forming an inter-gate dielectric coupled with the etch-stop film and the floating-gate structure at box 708, depositing a control gate material to the inter-gate dielectric at box 710, substantially removing the control gate material at box 712, and depositing a dielectric material to the etch-stop film and/or the inter-gate dielectric at box 714. Method 700 may describe formation of a stack of layers in a region between wordlines of a memory device. In other embodiments, a method 700 may omit operations 712 and 714 in a region within or underlying one or more wordlines of a memory device.

Method 700 may include depositing a tunnel dielectric to a surface of a semiconductor substrate 702 on which one or more floating-gate devices are to be formed. In an embodiment, depositing a tunnel dielectric on a surface of a semiconductor substrate 702 comprises depositing silicon oxide ($SiO_2$) on the surface of the semiconductor substrate wherein the semiconductor substrate comprises silicon.

Method 700 may further include forming a floating-gate structure on the tunnel dielectric 704. In an embodiment, the floating-gate structure comprises a first surface, a second surface, and a third surface, wherein the third surface is coupled with an etch-stop film 706 and is substantially parallel with the surface of the semiconductor substrate, the first surface being substantially parallel with the second surface, and the first surface being substantially perpendicular with the third surface.

Forming the floating-gate structure on the tunnel dielectric 704 may include depositing a floating-gate film comprising polysilicon, a metal, a metal nitride, a metal silicide, a metal silicon nitride, a metal carbide, a metal carbon nitride, or a conductive metal oxide, or combinations thereof. Polysilicon may comprise n-type or p-type doped polysilicon. In an embodiment, a metal comprises, for example, tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof. The metal nitride may comprise, for example, titanium nitride (TiN), tungsten nitride (WN), or tantalum nitride (TaN), or combinations thereof. The metal silicide may comprise, for example, titanium silicide (TiSi), tungsten silicide (WSi), tantalum silicide (TaSi), cobalt silicide (CoSi), platinum silicide (PtSi), nickel silicide (NiSi), or combinations thereof. The metal silicon nitride may comprise, for example, titanium silicon nitride (TiSiN), or tantalum silicon nitride (TaSiN), or combinations thereof. The metal carbide may comprise, for example, titanium carbide (TiC), zirconium carbide (ZrC), tantalum carbide (TaC), hafnium carbide (HfC), or aluminum carbide (AlC), or combinations thereof. The metal carbon nitride may comprise, for example, tantalum carbon nitride (TaCN), titanium carbon nitride (TiCN), or combinations thereof. A conductive metal oxide may comprise, for example, ruthenium oxide ($RuO_2$). Other material combinations are possible within the scope of the subject matter described herein. Depositing the floating-gate film may further comprise depositing a thickness less than about 100.

In an embodiment, forming the floating-gate structure on the tunnel dielectric 704 further includes depositing an etch-stop film to the floating-gate film wherein the etch-stop film comprises aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), silicon oxide ($SiO_2$), silicon oxynitride ($SiO_xN_y$), silicon nitride ($Si_xN_y$), or combinations thereof, in which x, y, and z represent suitable quantities of the respective elements. Depositing the etch-stop film may comprise depositing a thickness less than about 30 nm. Claimed subject matter is not limited in this regard. Other thicknesses for floating-gate film and etch-stop film may be used in other embodiments.

Forming the floating-gate structure on the tunnel dielectric 704 may further include recessing one or more trenches into the etch-stop film, the floating-gate film, the tunnel dielectric film, and the semiconductor substrate to form one or more isolation trenches for isolation dielectric. One or more trench isolation structures comprising a dielectric material may be formed in the one or more trenches by at least depositing the dielectric material to the one or more trenches. Processes such as CMP, etching, or other semiconductor fabrication processes may be used in other embodiments.

Method 700 may include depositing an inter-gate dielectric to the first surface and the second surface of the floating-gate structure and to the etch-stop film 708. Depositing an inter-gate dielectric 708 may comprise depositing silicon oxide ($SiO_2$), silicon nitride (SiN), alternating films of silicon oxide and silicon nitride (ONO), or NONON, or combinations thereof.

In an embodiment, method 700 includes depositing a control gate material to the inter-gate dielectric 710. Depositing a control gate material to the inter-gate dielectric 710 may include depositing polysilicon, a metal, a metal nitride, a metal silicide, a metal silicon nitride, a metal carbide, a metal carbon nitride, or a conductive metal oxide, or combinations thereof.

Method 700 may further include substantially removing the control gate material 712. In an embodiment, method 700 includes substantially removing the control gate material 712 wherein the etch-stop film prevents removal of the floating-gate structure, or wherein the etch-stop film serves as an etch barrier to the floating-gate structure, or combinations thereof. In an embodiment, the etch-stop film is more resistant to etching than the inter-gate dielectric when substantially removing the control gate material 712 using an etchant. In another embodiment, the etchant has a higher etch rate with respect to the inter-gate dielectric than with the etch-stop film. Substantially removing the control gate material 712 may include etching with an etchant comprising, for example, mixtures of oxygen ($O_2$) with hydrogen bromide (HBr), tetrafluoromethane ($CF_4$), nitrogen trifluoride ($NF_3$), chlorine ($Cl_2$), or sulfur hexafluoride ($SF_6$), or combinations thereof. Using an etch stop film as described herein may reduce microloading, increase vertical profile of the first and second surfaces of the floating-gate structure, increase etch uniformity, or combinations thereof.

A dielectric material may be deposited to the etch-stop film and/or the inter-gate dielectric 714. In an embodiment, depositing a dielectric material to be coupled with the etch-stop film 714 comprises depositing oxide, such as silicon oxide ($SiO_2$) to isolate floating-gate devices or to prevent shorting between control gates, or combinations thereof.

Other methods to fabricate a floating-gate device as described herein may be used in other embodiments. Method 700 may further include, for example, other semiconductor fabrication processes such as lithography, etch, thin films deposition, planarization, diffusion, metrology, or any other associated action with semiconductor fabrication.

Various operations may be described as multiple discrete operations in turn, in a manner that is most helpful in understanding the claimed subject matter. The order of description should not, however, be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 8:
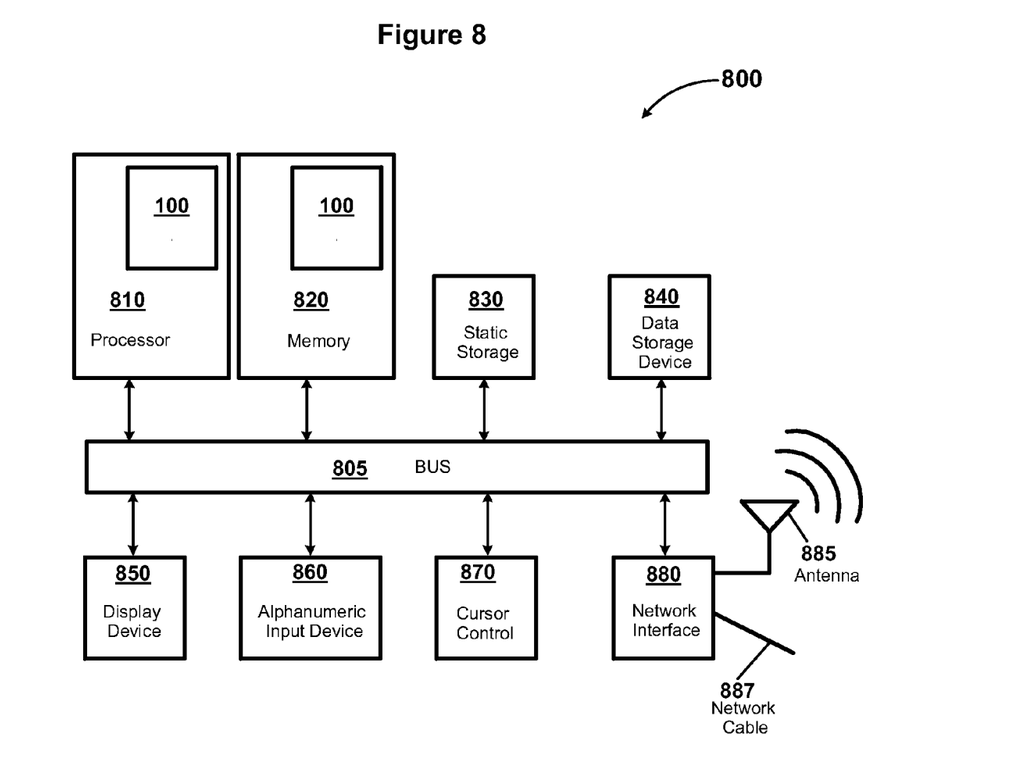
FIG. 8 is a diagram of an example system in which a floating gate device as described herein may be used, according to but one embodiment.

FIG. 8 is a diagram of an example system in which a floating-gate device as described herein may be used, according to but one embodiment. System 800 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 800 includes a floating gate device 100 as described herein. In an embodiment, a floating gate device 100 as described herein is part of an electronic system's processor 810 or memory 820. Electronic system 800 may include a processor 810 and memory 820 coupled with the processor 810, wherein the processor 810 or the memory 820, or combinations thereof, comprise a floating gate device 100 as described herein.

Electronic system 800 may include bus 805 or other communication device to communicate information, and processor 810 coupled to bus 805 that may process information. While electronic system 800 may be illustrated with a single processor, system 800 may include multiple processors and/or co-processors. In an embodiment, processor 810 includes a floating gate device 100 as described herein. System 800 may also include random access memory (RAM) or other storage device 820 (may be referred to as memory), coupled to bus 805 and may store information and instructions that may be executed by processor 810.

Memory 820 may also be used to store temporary variables or other intermediate information during execution of instructions by processor 810. Memory 820 is a flash memory device in one embodiment. In another embodiment, memory 820 includes a floating gate device 100 as described herein.

System 800 may also include read only memory (ROM) and/or other static storage device 830 coupled to bus 805 that may store static information and instructions for processor 810. Data storage device 840 may be coupled to bus 805 to store information and instructions. Data storage device 840 such as a magnetic disk or optical disc and corresponding drive may be coupled with electronic system 800.

Electronic system 800 may also be coupled via bus 805 to display device 850, such as a cathode ray tube (CRT) or liquid crystal display (LCD), to display information to a user. Alphanumeric input device 860, including alphanumeric and other keys, may be coupled to bus 805 to communicate information and command selections to processor 810. Another type of user input device is cursor control 870, such as a mouse, a trackball, or cursor direction keys to communicate information and command selections to processor 810 and to control cursor movement on display 850.

Electronic system 800 further may include one or more network interfaces 880 to provide access to network, such as a local area network. Network interface 880 may include, for example, a wireless network interface having antenna 885, which may represent one or more antennae. Network interface 880 may also include, for example, a wired network interface to communicate with remote devices via network cable 887, which may be, for example, an Ethernet cable, a coaxial cable, a fiber optic cable, a serial cable, or a parallel cable.

In one embodiment, network interface 880 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 880 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 800 includes one or more omnidirectional antennae 885, which may refer to an antenna that is at least partially omnidirectional and/or substantially omnidirectional, and a processor 810 coupled to communicate via the antennae.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. An apparatus, comprising:
  a semiconductor substrate comprising a surface on which one or more floating-gate devices are formed;
  a tunnel dielectric coupled with the surface of the semiconductor substrate;
  a floating-gate structure coupled with the tunnel dielectric, the floating-gate structure comprising a first surface, a second surface, and a third surface, wherein the third surface is substantially parallel with the surface of the semiconductor substrate and wherein the first surface is substantially parallel with the second surface and substantially perpendicular with the third surface;
an etch-stop film directly coupled with the third surface of the floating-gate structure; and
an inter-gate dielectric coupled with the first surface and the second surface of the floating-gate structure wherein the inter-gate dielectric comprises a material that is less resistant to an etchant that removes material of a control gate structure than the etch-stop film.

2. An apparatus according to claim 1, wherein the etch-stop film comprises aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), silicon oxide ($SiO_2$), silicon oxynitride ($SiO_xN_y$), silicon nitride ($Si_xN_y$), or combinations thereof, in which x, y, and z represent suitable quantities of the respective elements.

3. An apparatus according to claim 1, wherein the etch-stop film comprises a thickness that is less than about 30 nanometers and wherein the etch-stop film serves as a blocking dielectric between the floating-gate structure and the control gate structure.

4. An apparatus according to claim 1 wherein the inter-gate dielectric comprises silicon oxide ($SiO_2$), silicon nitride (SiN), alternating films of silicon oxide and silicon nitride (ONO), or NONON, or combinations thereof.

5. An apparatus according to claim 1 wherein the etchant comprises a mixture of oxygen ($O_2$) with hydrogen bromide (HBr), tetrafluoromethane ($CF_4$), nitrogen trifluoride ($NF_3$), chlorine ($Cl_2$), or sulfur hexafluoride ($SF_6$), or combinations thereof.

6. An apparatus according to claim 1, wherein the semiconductor substrate comprises silicon, the tunnel dielectric comprises silicon oxide ($SiO_2$), and wherein the floating-gate structure comprises polysilicon, metal, metal nitride, metal silicide, metal silicon nitride, metal carbide, metal carbon nitride, or a conductive metal oxide, or combinations thereof.

7. An apparatus according to claim 1, further comprising:
the control gate structure wherein the control gate structure is coupled with an etch-stop structure or with the inter-gate dielectric, or combinations thereof, the control gate structure comprising polysilicon, metal, metal nitride, metal silicide, metal silicon nitride, metal carbide, metal carbon nitride, or a conductive metal oxide, or combinations thereof.

8. A system, comprising:
a processor; and
a memory coupled with the processor, wherein the processor or the memory, or combinations thereof, comprise:
a semiconductor substrate comprising a surface on which one or more floating-gate devices are formed;
a tunnel dielectric coupled with the surface of the semiconductor substrate;
a floating-gate structure coupled with the tunnel dielectric, the floating-gate structure comprising a first surface, a second surface, and a third surface, wherein the third surface is substantially parallel with the surface of the semiconductor substrate and wherein the first surface is substantially parallel with the second surface and substantially perpendicular with the third surface;
an etch-stop film directly coupled with the third surface of the floating-gate structure; and
an inter-gate dielectric coupled with the first surface and the second surface of the floating-gate structure wherein the inter-gate dielectric comprises a material that is less resistant to an etchant that removes material of a control gate structure than the etch-stop film.

9. A system according to claim 8, wherein the etch-stop film comprises aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), silicon oxide ($SiO_2$), silicon oxynitride ($SiO_xN_y$), silicon nitride ($Si_xN_y$), or combinations thereof, in which x, y, and z represent suitable quantities of the respective elements.

10. A system according to claim 8, wherein the etch-stop film comprises a thickness that is less than about 30 nanometers and wherein the etch-stop film serves as a blocking dielectric between the floating-gate structure and the control gate structure.

11. A system according to claim 8, wherein the semiconductor substrate comprises silicon, the tunnel dielectric comprises silicon oxide ($SiO_2$), the floating-gate structure comprises polysilicon, metal, metal nitride, metal silicide, metal silicon nitride, metal carbide, metal carbon nitride, or a conductive metal oxide, or combinations thereof, the inter-gate dielectric comprises silicon oxide ($SiO_2$), silicon nitride (SiN), alternating films of silicon oxide and silicon nitride (ONO), or NONON, or combinations thereof, the control gate structure comprises polysilicon, metal, metal nitride, metal silicide, metal silicon nitride, metal carbide, metal carbon nitride, or a conductive metal oxide, or combinations thereof, and wherein the etchant comprises a mixture of oxygen ($O_2$) with hydrogen bromide (HBr), tetrafluoromethane ($CF_4$), nitrogen trifluoride ($NF_3$), chlorine ($Cl_2$), or sulfur hexafluoride ($SF_6$), or combinations thereof.

12. A system according to claim 8, further comprising:
the control gate structure wherein the control gate structure is coupled with an etch-stop structure or with the inter-gate dielectric, or combinations thereof, the control gate structure comprising polysilicon, metal, metal nitride, metal silicide, metal silicon nitride, metal carbide, metal carbon nitride, or a conductive metal oxide, or combinations thereof.

\* \* \* \* \*